(12) United States Patent
Kikawa et al.

(10) Patent No.: US 6,455,876 B1
(45) Date of Patent: Sep. 24, 2002

(54) SEMICONDUCTOR RADIATIVE DEVICE

(75) Inventors: Takeshi Kikawa, Kodaira; Shigeo Goto, Tokorozawa, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/931,894

(22) Filed: Aug. 20, 2001

(30) Foreign Application Priority Data

Jan. 24, 2001 (JP) ......................................... 2001-015410

(51) Int. Cl.[7] ..................... H01L 33/00; H01S 5/00; H01S 3/08
(52) U.S. Cl. ..................... 257/98; 257/102; 372/49; 372/99
(58) Field of Search ..................... 257/98, 103, 102; 372/45, 46, 49, 50, 99

(56) References Cited

U.S. PATENT DOCUMENTS

| | | | |
|---|---|---|---|
| 4,280,107 A | * | 7/1981 | Scifres et al. ............... 359/584 |
| 5,892,786 A | * | 4/1999 | Lott ............................. 372/50 |
| RE37,354 E | * | 9/2001 | Welch et al. ................ 372/101 |

* cited by examiner

Primary Examiner—Minh Loan Tran
Assistant Examiner—Tan Tran
(74) Attorney, Agent, or Firm—Antonelli, Terry, Sotut & Kraus, LLP

(57) ABSTRACT

A semiconductor radiative device comprises a layered film comprised of a low-refraction first dielectric film and a high-refraction second dielectric film having a refraction index greater than that of the first dielectric film, and formed on at least one of facets of an optical cavity. The high-refraction second dielectric film is an amorphous dielectric film of nitrogen-doped hydrogenated silicon. The semiconductor radiative device is capable of stably operating in a high-output mode for a long period of time.

9 Claims, 5 Drawing Sheets

SEMICONDUCTOR RADIATIVE DEVICE

BACKGROUND OF THE INVENTION

The present invention relates to a semiconductor laser and, more particularly, to a high-power laser having an oscillation wavelength in the range of 600 to 700 nm suitable for use in an optical information system or a semiconductor laser having an oscillation wavelength in the range of 1.47 to 1.62 µm suitable for use in an optical communication system.

Currently, a reliable high-power laser is needed for writing information to an optical disk or a magnetooptical disk. The semiconductor laser is required to operate stably in a fundamental mode for a long time. An insulating coating film is formed on a semiconductor surface forming the radiation facet of the semiconductor laser to increase external differential quantum efficiency by obtaining a proper reflectance and to prevent the reduction of maximum output due to the increase of threshold carrier density. Many lasers use a silicon oxide thin film as an antireflection film to be formed on one of the surfaces of a resonator, and a layered film comprised of a silicon oxide thin film and a hydrogenated amorphous silicon thin film as a high-reflection film to be formed on the other surface. These coating films are mentioned in T. Uasa et al., APPLIED PHYSICS LETTERS, Vol. 34, pp. 685.

Wavelength division multiplexing of optical communication has been practically applied to an optical communication system to deal with further enhanced large-capacity transmission. Wavelength division multiplex optical communication employs a modulator-integrated light source formed by combining an optical modulator and a semiconductor laser, i.e., a light source, in one chip. The radiation facet of the modulator-integrated light source is coated with an antireflection film. These coating films are mentioned in K. Kudo et al., ELECTRONICS LETTERS, Vol. 34, No. 20, pp. 1946.

The high-reflection coating film which has been used by many conventional semiconductor lasers is a film comprised of a silicon oxide film and a hydrogenated silicon thin film and having periodic construction. The high-reflection coating film is designed so as to have a necessary reflectance. If a high-power laser having an oscillation wavelength of 1 µm or below and capable of emitting light having a density of several megawatts per square centimeter is driven continuously for a constant-power operation, the light absorption of the high-reflection film of such a coating film increases sharply with time and the laser is unable to operate in a constant-power mode.

The hydrogenated amorphous silicon film is heated by heat generated by light absorption in laser operation and hydrogen atoms contained in the hydrogenated amorphous silicon film and bonded to silicon atoms are separated from silicone atoms. Consequently, optical bandgap narrows and the light absorption of the amorphous silicon film increases. Thus, the effective quantum efficiency decreases and thereby an operating current increases. Thus, such a high-reflection coating film is unsuitable for the high-power laser.

A silicon nitride thin film may be used to solve such a problem. However, a silicon nitride thin film has a refractive index of about 1.95 or below, which is nearly equal to the refractive index of a silicon oxide thin film. Therefore, when the silicon nitride thin film used as a facet coating film, the number of layers must be five periods or above, which is twice as large as the number of layers. When the hydrogenated amorphous silicon thin film is used, a predetermined reflectance can be obtained by a film of a periodic structure of two or three periods. The allowable range of thickness variation of the silicon nitride thin film is as narrow as ±6%.

SUMMARY OF THE INVENTION

It is a first object of the present invention to provide a semiconductor radiative device capable of stably operating for a high-power light-emitting operation for a long period of operation in an operating mode in which oscillation wavelength is in the range of 600 nm to 1 µm and light having a density of several megawatts per square centimeter is emitted.

The semiconductor radiative device can be easily fabricated and operating current does not increase after the semiconductor radiative device is used for a long time. Thus, the semiconductor radiative device has a long service life and high reliability.

A modulator-integrated light source for wavelength division multiplex optical communication needs an antireflection film having a reflectance of 0.1% or below for coating the radiative facet. When the degree of wavelength division multiplexing is large and light of wavelengths in a wide wavelength range is used, it is difficult for a single antireflection film to meet a requirement that the reflectance of the antireflection film with the light of those wavelengths be 0.1% or below.

Another object of the present invention is to provide an antireflection film capable of reflecting light of wavelengths in an oscillation wavelength range of 1.47 µm to 1.62 µm used for wavelength division multiplex communication.

According to a first aspect of the present invention, a semiconductor radiative device includes a layered film comprised of a low-refraction first dielectric film and a high-refraction second dielectric film having a refraction index greater than that of the first dielectric film, and formed on at least one of the facets of an optical cavity, wherein the high-refraction second dielectric film is an amorphous dielectric film containing silicon, hydrogen and nitrogen.

According to a second aspect of the present invention, a semiconductor radiative device includes a layered film comprised of a low-refraction first dielectric film and a high-refraction second dielectric film having a refraction index greater than that of the first dielectric film, and formed on at least one of the facets of an optical cavity, wherein the high-refraction second dielectric film is an amorphous dielectric film containing silicon, hydrogen and nitrogen, and having a refractive index of 2.5 or above with light of a wavelength to be emitted by the semiconductor radiative device.

According to a third aspect of the present invention, a semiconductor radiative device includes a layered film comprised of a first dielectric film and a high-refraction second dielectric film having a refraction index greater than that of the first dielectric film, and formed on at least one of the facets of an optical cavity, wherein the high-refraction second dielectric film is an amorphous dielectric film containing silicon, hydrogen and nitrogen, and having a refractive index of 2.5 or above and an extinction coefficient of 0.005 or below with light of a wavelength to be emitted by the semiconductor radiative device.

The amorphous dielectric film containing silicon, hydrogen and nitrogen is used as a component member of the high-reflection film (HR film) or the antireflection film (AR film). The HR film or the AR film is designed satisfactorily by an ordinary design method.

The HR film is formed by layering a high-refraction film and a low-refraction film. The amorphous dielectric film according to the present invention having a high refractive index is very preferable. The layering period is determined taking into consideration a desired reflectance and degree of light absorption. Practically, the layering period is in the range of two periods to five periods. A representative number of periods is three.

The layered coating film including an amorphous dielectric film according to the present invention is suitable for use in a compound semiconductor radiative device having an oscillation wavelength of 600 nm or above. The layered coating film is suitable for use as a HR film for a semiconductor radiative device having an oscillation wavelength in a short-wavelength region of 600 to 680 nm. The amorphous dielectric film maintains a high reflectance and has a small light absorption coefficient with light of the oscillation wavelength of the semiconductor radiative device. Thus, the amorphous dielectric film enables the constant-power operation of the semiconductor radiative device.

The thickness of an AR film as the dielectric film of a semiconductor radiative device having an oscillation wavelength in the long-wavelength region of 1.3 to 1.55 $\mu$m can be easily controlled; that is an allowable range for the thickness of the dielectric film is wide.

It is particularly preferable that the amorphous dielectric film does not contain any oxygen. In some cases, the amorphous dielectric film contains oxygen in an oxygen content of, for example, about 0.1% in the process of forming the amorphous dielectric film. Such an oxygen content is insignificant. However, it is desirable to avoid oxygen mixing in or remaining in the amorphous dielectric film because oxygen contained in the amorphous dielectric film reduces the refraction index of the amorphous dielectric film.

DESCRIPTION OF THE PREFERRED EMBODIMENTS

Figure 1:
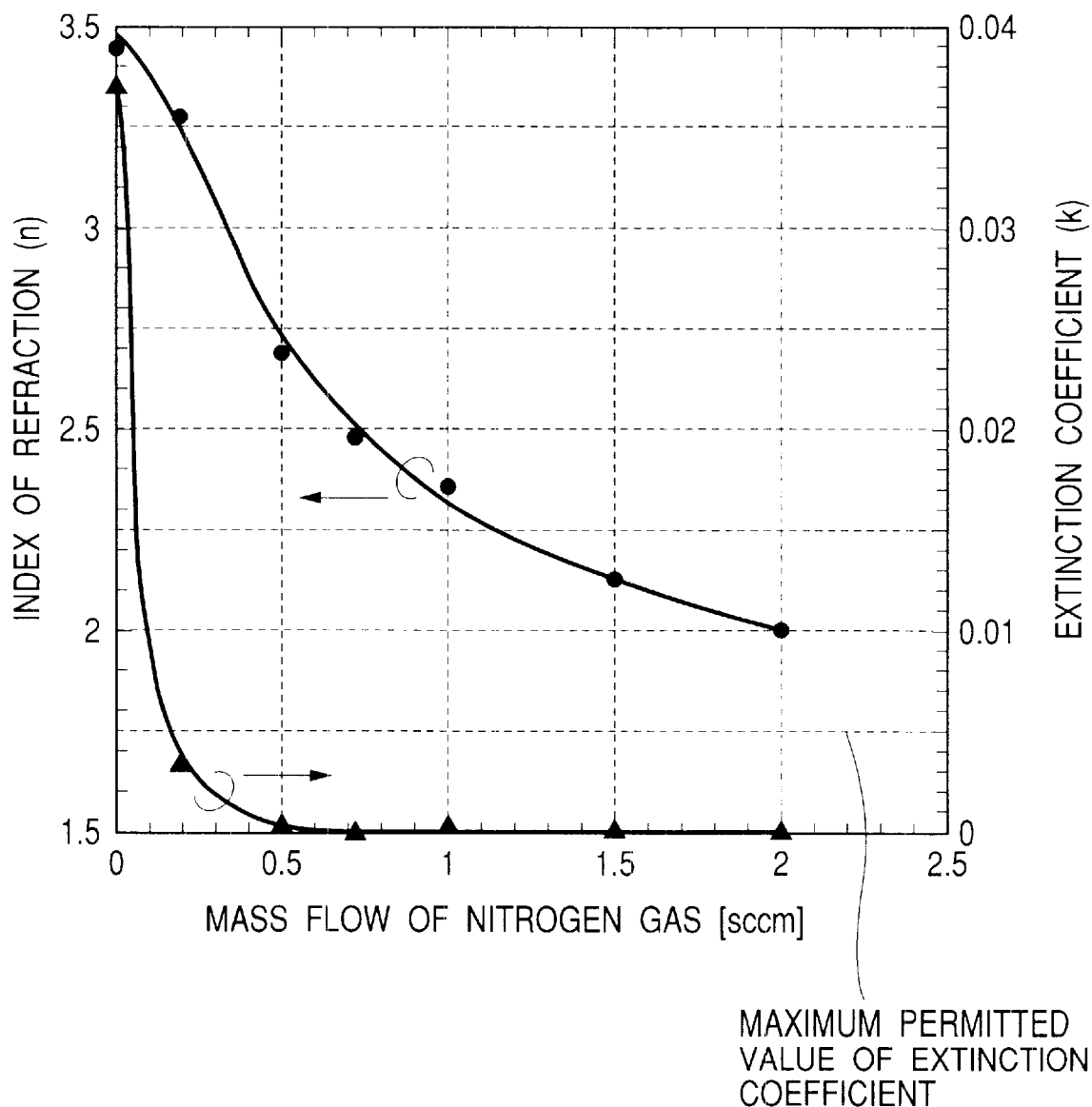
FIG. 1 is a graph showing the dependence of the refractive index and extinction coefficient of a hydrogenated amorphous silicon film containing nitrogen according to the present invention on nitrogen supply rate.

Examples of the present invention will be enumerated and fundamentals of the present invention will be described prior to the description of the preferred embodiments of the present invention.

As mentioned above, a representative semiconductor radiative device according to the present invention comprises an optical cavity formed on a semiconductor substrate and having semiconductor crystals; a layered film comprised of a low-refraction first dielectric film and a high-refraction second dielectric film having a refraction index greater than that of the first dielectric film, and formed on at least one of the facets of the optical cavity, wherein the high-refraction second dielectric film is an amorphous dielectric film containing silicon, hydrogen and nitrogen. Typically, the semiconductor radiative device is a semiconductor laser. However, as will be mentioned later, the present invention is applicable also to a light-emitting device including a laser oscillator and an optical modulator mounted on a single substrate.

The low-refraction first dielectric film may be such as formed of materials commonly used in the field of semiconductor lasers and semiconductor light-emitting devices. Representative ones of such materials are silicon dioxide ($SiO_2$), MgF and $Al_2O_3$.

Examples of the present invention will be enumerated on the basis of the aforesaid basic form.

A semiconductor laser in a first example of the present invention employs a layered coating film comprised of a low-refraction film and a high-refraction film and formed on a radiation facet to obtain a predetermined reflectance. The high-refraction film is an amorphous film containing at least silicon, hydrogen and nitrogen and not containing oxygen, and having a refractive index of 2.5 or above and an extinction coefficient of 0.005 or below with light of the oscillation wavelength.

In a semiconductor laser in a second example, the amorphous film used as the high-refraction film is formed by a vapor-phase reaction.

In a semiconductor laser in a third example of the present invention, the oscillation wavelength of the semiconductor laser is 600 nm or above and the optical output power of the same is $1 \times 10^6$ W/cm$^2$.

In a semiconductor laser in a fourth example of the present invention, the ratio of the number of hydrogen atoms to that of silicon atoms contained in the amorphous film used as the high-refraction film is in the range of 1/5±10%, and the ratio of the number of nitrogen atoms to that of silicon atoms is 1/8 or below, preferably, 1/10 or below. When the hydrogen content is outside the aforesaid range, light absorption is excessively large. When the nitrogen content is outside the aforesaid limit, refractive index is excessively small.

Generally, an amorphous silicon film contains nitrogen in 4 to 40% by atom and hydrogen in 10 to 20% by atom.

A semiconductor laser in a fifth example of the present invention has an oscillation wavelength in the range of 1.55 m±80 nm, the square of the refractive index of an amorphous film used as the high-refraction film with light of the oscillation wavelength is equal to the product of the square of the refraction index of the low-refraction film and the effective refraction index of the emission region of the semiconductor laser, the high-refraction film is in contact with the surface of the semiconductor laser, the low-refraction film is exposed to the atmosphere, and the respective cavity lengths of the high-refraction film and the low-refraction film are equal to a quarter wavelength.

In a sixth example of the present invention, in the fifth example, the low-refraction film is a silicon dioxide film, and the amorphous film used as the high-refraction film has a refractive index with light of the oscillation wavelength in the range of 2.575±0.01.

An amorphous silicon thin film relating to the present invention will be described.

When forming the amorphous silicon thin film by a sputtering method, a vapor deposition method or a chemical vapor deposition method, it is essential to add a small amount of molecules, radicals or ions containing nitrogen molecules, nitrogen atoms, nitrogen radicals, nitrogen ions or nitrogen and not containing oxygen to a source material. Generally, the higher hydrogen concentration, when forming a hydrogenated amorphous silicon film by a vapor-phase reaction, the shorter is edge wavelength. However, if hydrogen concentration exceeds a certain level, Si—$H_n$ ($n \geq 2$) bonds increase and Si—H bonds density saturate. The optical bandgap of the hydrogenated amorphous silicon thin film is dependent on Si—H bond density. Therefore, the edge wavelength saturates at about 900 nm. An element capable of increasing the optical bandgap of the amorphous silicon film other than hydrogen must be added to the source material to reduce the edge wavelength of the amorphous silicon film. When adding such an element to the source material, attention must be taken not to reduce the refractive index of the amorphous silicon film.

When source gases containing nitrogen is supplied Si—H bonds and Si—N bonds are produced, so that the reduction of the refractive index is suppressed and the optical absorption coefficient can be reduced. Si—Si bonds are the principal bonds of the hydrogenated amorphous silicon film of the present invention and H atoms and N atoms are introduced into the Si—Si bonds.

FIG. 1 shows the dependence of the refractive index and extinction coefficient of a hydrogenated amorphous silicon film containing nitrogen with light of 650 nm in wavelength, in which nitrogen supply rate at which nitrogen is supplied into a film forming atmosphere is measured on the horizontal axis and the refractive index and extinction coefficient of the dielectric film are measured on the vertical axis. It is known from FIG. 1 that the addition of a small amount of nitrogen to the dielectric film reduces light absorption greatly; that is, the reduction of refractive index is suppressed and light absorption is reduced greatly. The present invention utilizes such a fact for preventing the degradation with operating time of the characteristics of a laser capable of emitting laser light of 0.68 or 0.65 $\mu$m in wavelength at an output power of 1 MW/cm$^2$ or above for an optical recording apparatus, and a laser capable of emitting laser light of 0.98 $\mu$m in wavelength at an output power of 2 MW/cm$^2$ or above.

Similarly, the refractive index of the hydrogenated amorphous silicon film can be varied in the range of 2 to 3 and the reflectance with light of wavelengths in a wide wavelength range can be limited to 0.1% or below by properly adjusting the nitrogen content of the hydrogenated amorphous silicon film. The disturbance of transmitted signals caused by light reflected by the radiation facet toward an LD can be suppressed by limiting the reflectance to 0.1% or below. The effective signal disturbance is negligible when the reflectance is in the aforesaid range.

First Embodiment

Figure 2:
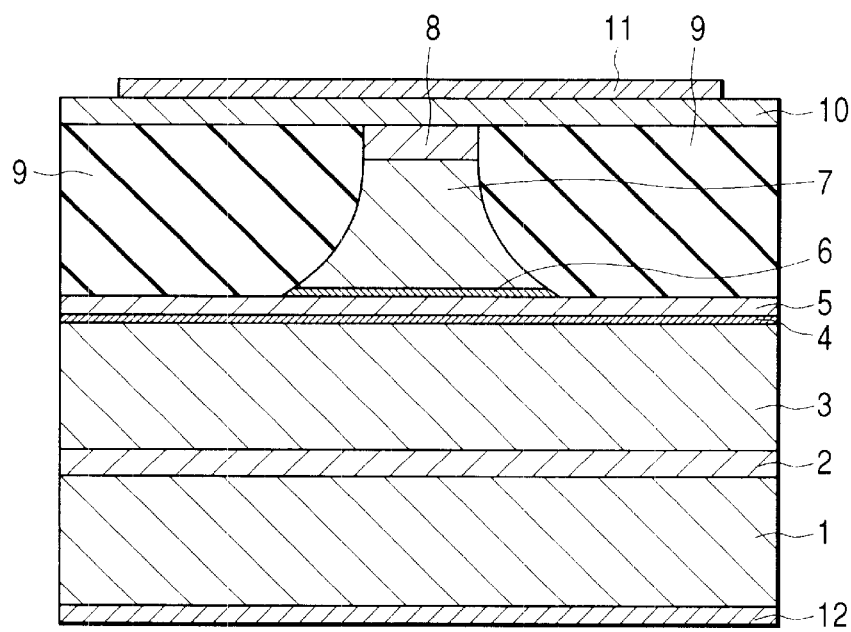
FIG. 2 is a typical sectional view of a laser in a first embodiment according to the present invention on a plane intersecting the direction of travel of light.
Figure 3:
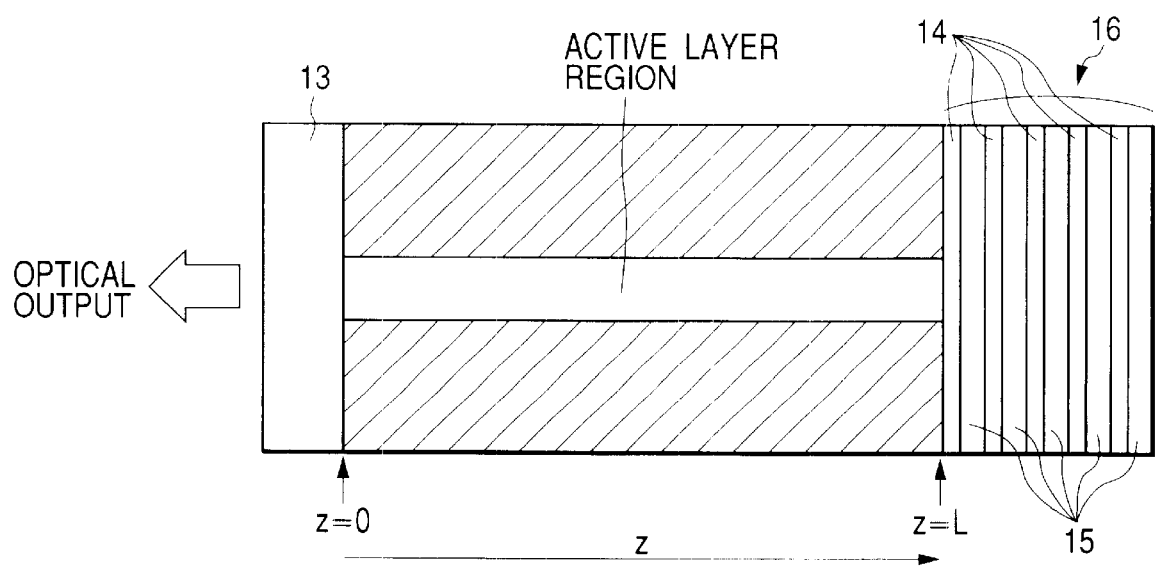
FIG. 3 is a typical plan view of the laser in the first embodiment.

A high-power semiconductor laser (LD) which emits light in a 680 nm wavelength region in a first embodiment according to the present invention will be described with reference to FIGS. 2 and 3. The semiconductor laser is applied to a light source for writing data to optical disks and magnetooptical disks. FIG. 2 is a typical sectional view of the semiconductor laser on a plane intersecting the direction of travel of light and FIG. 3 is a typical plan view of the semiconductor laser.

The construction of the semiconductor laser will be described in terms of the steps of fabrication of the same. A GaAs buffer layer 2, an n-$(Al_xGa_{1-x})$InP cladding layer 3 (x=0.7) lattice matched with GaAs, a strained quantum well layer 4 comprised of a 4 nm thick $(Al_yGa_{1-y})$InP barrier layer (y=0.45) lattice matched with GaAs, an 8 nm thick $In_zGa_{1-z}$P strained quantum well layer (z=0.6) and a 4 nm thick $(Al_sGa_{1-s})$InP SCH (separate confinement heterostructure) layer (s=0.55), a p-$(Al_tGa_{1-t})$InP cladding layer (t=0.7) 5 lattice matched with GaAs, a p-InGaP etch stop layer 6 lattice matched with GaAs, a p-$(Al_uGa_{1-u})$InP cladding layer (u=0.7) 7 lattice matched with GaAs, and a p-$Al_vGa_{1-v}$As cap layer (v=0.7) 8 are formed in that order on an n-GaAs substrate 1. The semiconductor films are formed by a MOVPE method, a CBE method or a MBE method.

Then, the layers 7 and 8 are etched by an ordinary etching method using an etching mask of an oxide film in the shape of a ridge as shown in FIG. 2. The etching method may be any suitable method, such as a wet etching method, a RIE method, a RIBE method or an ion milling method. Etching is stopped by the p-InGaP etch stop layer 6 so that the strained quantum well layer 4 may not be etched.

An n-GaAs current confinement layer 9 shown in FIG. 2 is grown selectively in a growth furnace by a MOVPE method using the etching mask of the oxide film as a selective growth mask. Then the substrate 1 is taken out of the growth furnace and the oxide film used as the selective growth mask is removed by etching. Subsequently, a p-GaAs contact layer 10 is formed by a MOVPE method or a MBE method.

A p-side ohmic electrode 11, an n-side ohmic electrode 12 are formed. A laser device of a fundamental structure having a cavity length of 600 $\mu$m is formed by a cleaving method.

Then an aluminum oxide film ($Al_2O_3$ film) having a caitylen $\lambda/4$ ($\lambda$ is oscillation wavelength) is deposited on the front facet of the laser device to form an antireflection film (AR film) 13 by a reactive sputtering method. The position of the AR film 13 on a z-axis (FIG. 3) parallel to the cavity length is at z=0.

A six-layer high-reflectance film (HR film) 16 comprised of silicon dioxide films ($SiO_2$ films) 14 of $\lambda/4$ in thickness and nitrogen-doped hydrogenated amorphous silicon films (a-Si:H(N) films) 15 is formed on the back facet of the laser device at z=L.

The a-Si:H(N) films 15 are formed by an ECR sputtering method. The ECR sputtering method supplies Ar gas at 20 sccm, hydrogen gas at 6 sccm and nitrogen gas at 0.5 sccm into a film deposition vessel, creates a plasma by electron cyclotron resonance of 500 w and supplies radio frequency (RF) power of 500 W to a Si target. The a-Si:H(N) film has a refractive index of 2.5 with light of 0.68 $\mu$m in wavelength and does not absorb such light. In the a-Si:H(N) film, the ratio in the number of atoms between nitrogen, hydrogen and silicon is 1:2:10. The laser device thus fabricated is bonded to a heat sink. A sample semiconductor laser fabricated by the foregoing steps was driven continuously at room temperature by a threshold current of about 14 mA. The oscillation wavelength of the sample semiconductor laser was about 0.68 $\mu$m. The sample semiconductor laser operated stably for fundamental lateral mode lasing up to 150 mW. The maximum optical output was 300 mW or above. Thirty sample semiconductor lasers were driven continuously for a constant output of 50 mW in an environment of 80° C. An initial driving current was about 200 mA and all the sample semiconductor lasers operated stably for 50,000 hr or above without entailing the degradation of the HR films.

The method of fabricating the semiconductor laser in the first embodiment uses the ECR sputtering method for forming the thin films. Those thin films may be formed by some other method, such as a plasma-assisted chemical vapor deposition method (p-CVD method), an electron beam deposition method (EB deposition method), an ion beam deposition method (IB deposition method), a helicon wave plasma-enhanced excitation deposition method, a RF plasma sputtering method or a magnetron sputtering method. Although the method of fabricating the semiconductor laser in the first embodiment uses nitrogen gas as nitrogen source, molecules containing nitrogen and not containing oxygen, such as ammonia ($NH_3$), anhydrous hydrazine ($N_2H_4$) or hydrogen azide ($HN_3$) may be used instead of nitrogen gas. Naturally, nitrogen may be supplied in active radical beams, ion beams or atomic beams by using an ECR plasma, a RF plasma or a helicon wave plasma or by a thermal excitation method, an electron beam excitation method or a glow discharge method instead of supplying nitrogen gas together with hydrogen gas and argon gas.

Figure 7:
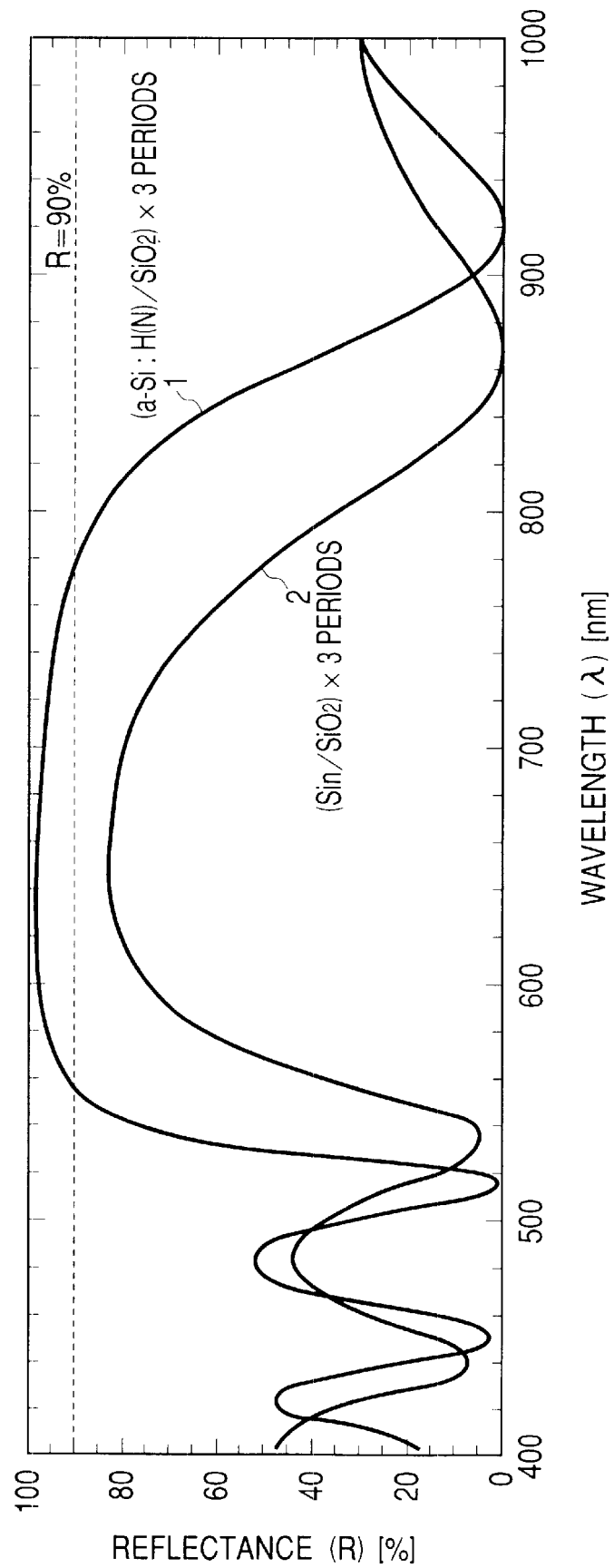
FIG. 7 is a graph comparatively showing the reflection characteristics of layered films.

FIG. 7 is a graph comparatively showing the reflection characteristics of layered films each of an a-Si:H(N) film and a silicon dioxide film employed in the semiconductor lasers which emit light in a 650 nm wavelength region according to the present invention. The layered film is comprised of three periods each of two films. Shown also in FIG. 7 is the reflection characteristics of a layered film comprised of three periods each of a $SiN/SiO_2$ film. In FIG. 7 wavelength (nm) is measured on the horizontal axis and reflectance (%) is measured on the vertical axis. A curve 1 represents the reflection characteristics of the layered film including the a-Si:H(N) films according to the present invention and a curve 2 represents the reflection characteristics of the comparative layered film including the $SiN/SiO_2$ films. As obvious from FIG. 7, the layered film according to the present invention has a high reflectance with light of wavelengths in a wavelength range wider than that of wavelengths with which the comparative layered film has a high reflectance.

Second Embodiment

Figure 4:
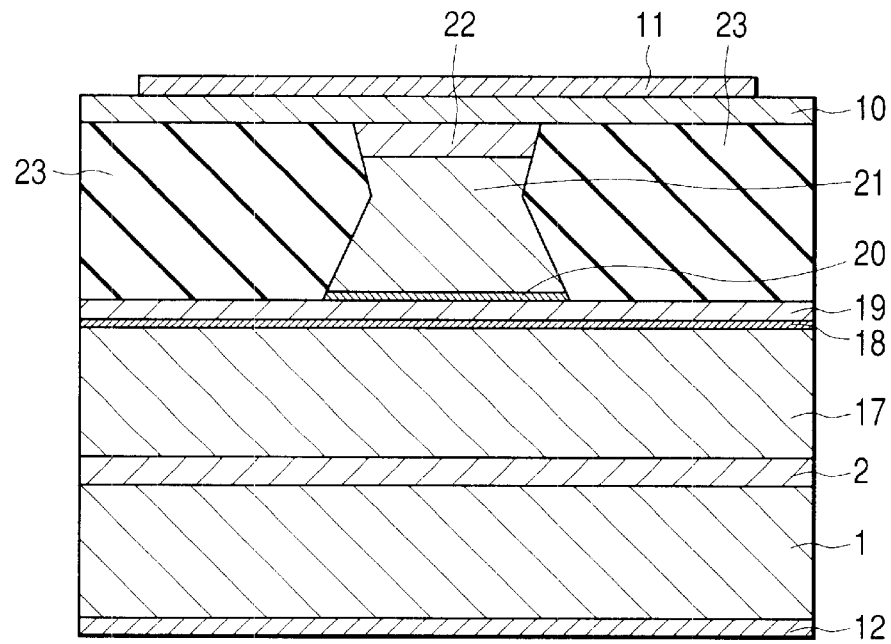
FIG. 4 is a typical sectional view of a laser in a second embodiment according to the present invention on a plane intersecting the direction of travel of light.
Figure 5:
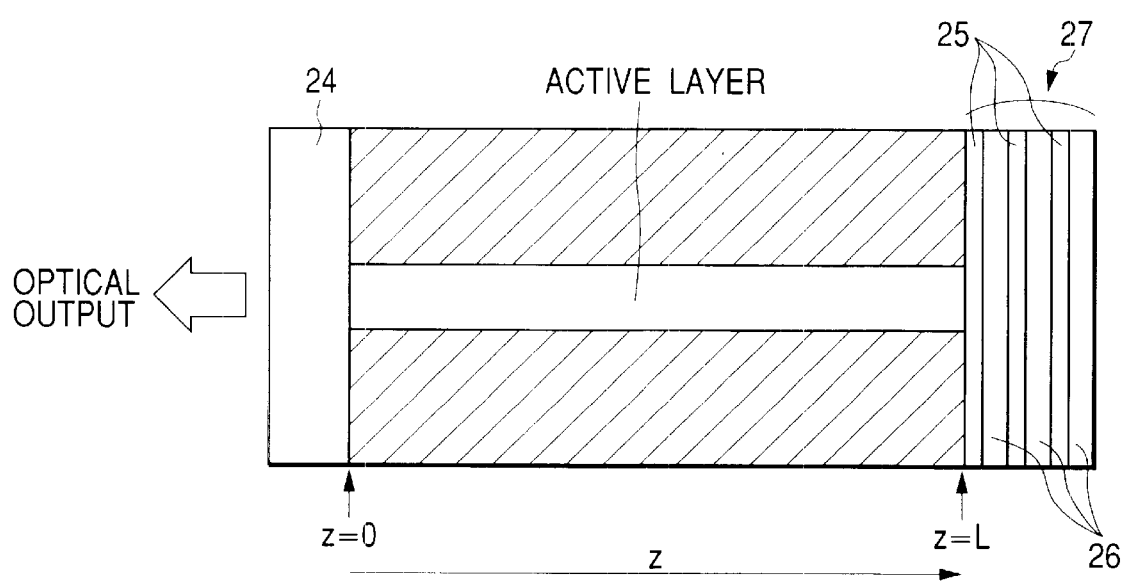
FIG. 5 is a typical plan view of the laser in the second embodiment.

A high-power semiconductor laser in a second embodiment according to the present invention will be described with reference to FIGS. 4 and 5. The semiconductor laser emits light in the 0.98 μm wavelength region. The semiconductor laser is used for exciting a rare earth-doped optical fiber amplifier employed in a relay or a receiver included in an optical transmission system. FIG. 4 is a typical sectional view of the semiconductor laser on a plane intersecting the direction of travel of light and FIG. 5 is a typical plan view of the semiconductor laser.

The construction of the semiconductor laser will be described in terms of the steps of fabrication of the same. A GaAs buffer layer 2, an n-InGaP cladding layer 17 lattice matched with GaAs, a strained quantum well layer 18 comprised of a 35 nm thick $In_{1-x}Ga_xAs_yP_{1-y}$ barrier layer (x=0.82, y=0.63) and a 7 nm thick $In_zGa_{1-z}As_{1-z}$ strained quantum well layer (z=0.16), a p-InGaP cladding layer 19 lattice matched with the GaAs substrate, a p-GaAs optical waveguide layer 20, a p-InGaP cladding layer 21 lattice matched with GaAs, and a p-GaAs cap layer 22 are formed in that order on an n-GaAs substrate 1. The semiconductor films are formed by a MOVPE method, a gas-source MBE method or a CBE method.

Then, the layers 21 and 22 are etched by an ordinary hot-etching method using an etching mask of an oxide film in a ridge 21 as shown in FIG. 4. The etching method may be any suitable method, such as a wet etching method, a RIE method, a RIBE method or an ion milling method. Etching is stopped in the p-InGaP cladding layer 19 so that the p-GaAs optical waveguide layer 22 is removed completely and the strained quantum well layer 18 may not be etched.

An n-InGaP current confinement layer 23 shown in FIG. 4 is grown selectively in a growth furnace by a MOVPE method using the etching mask of the oxide film as a selective growth mask. Then the substrate 1 is taken out of the growth furnace and the oxide film used as the selective growth mask is removed by etching. Subsequently, a p-GaAs contact layer 10 is formed by a MOVPE method or a MBE method. A p-side ohmic electrode 11, an n-side ohmic electrode 12 are formed. A laser device having a cavity length of 900 μm is formed by a cleaving method.

Then an AR film 24 of aluminum oxide ($Al_2O_3$) having a cavity length of λ/4 (λ is oscillation wavelength) is deposited on the front facet of the laser device by an ECR sputtering method. The position of the AR film 24 on a z-axis (FIG. 3) parallel to the cavity length is at z=0. A six-layer HR film 27 comprised of $SiO_2$ thin films 25 of λ/4 in thickness and a-Si:H(N) films 26 of λ/4 in thickness is formed on the back facet of the laser device at z=L.

The a-Si:H(N) thin films 25 are formed by an ECR sputtering method. The ECR sputtering method supplies Ar gas at 20 sccm, produces a plasma by an ECR output of 500 W and a RF output of 500 W, supplies hydrogen gas at 6 sccm and nitrogen gas at 0.2 sccm into the plasma, and supplies ECR power of 500 W to form the a-Si:H(N) film. The a-Si:H(N) film has a refractive index of 3.0 with light of 0.98 μm in wavelength and does not absorb such light. The laser device thus fabricated is bonded to a heat sink. A sample semiconductor laser fabricated by the foregoing steps was driven continuously at room temperature by a threshold current of about 10 mA. The oscillation wavelength of the sample semiconductor laser was about 0.98 μm. The sample semiconductor laser operated stably for fundamental lateral mode lasing up to 580 mW. Facet degradation did not occur when optical output was increased. The maximum optical output of 800 mW was limited by thermal saturation. Thirty sample semiconductor lasers were driven continuously for a constant output of 200 mW in an environment of 80° C. An initial driving current was about 205 mA and all the sample semiconductor lasers operated stably for 100,000 hr or above without entailing facet degradation.

The method of fabricating the semiconductor laser in the second embodiment uses the ECR sputtering method for forming the protective films. Those protective films may be formed by some other method, such as a plasma-assisted chemical vapor deposition method (p-CVD method), an electron beam deposition method (EB deposition method), an ion beam deposition method (IB deposition method), a helicon wave plasma-enhanced excitation deposition method, a RF plasma sputtering method or a magnetron sputtering method. Although the method of fabricating the semiconductor laser in the second embodiment uses nitrogen gas as nitrogen source, molecules containing nitrogen and not containing oxygen, such as ammonia ($NH_3$), anhydrous hydrazine ($N_2H_4$) or hydrogen azide ($HN_3$) may be used instead of nitrogen gas. Naturally, nitrogen may be supplied in active radical beams, ion beams or atomic beams by using an ECR plasma, a RF plasma or a helicon wave plasma or by a thermal excitation method, an electron beam excitation method or a glow discharge method instead of supplying nitrogen gas together with hydrogen gas and argon gas.

The active layer of the second embodiment may be a GRIN-SCH active layer (graded index-separate confinement heterostructure active layer) formed by changing the composition of a SCH layer in steps. Since the present invention does not depend on a waveguide structure, a BH structure (buried heterostructure) may be employed and the present invention may be applied to a surface-emitting laser.

Materials for forming the semiconductor laser of the present invention are not limited to those mentioned above. The present invention is applicable not only to the aforesaid semiconductor lasers using an InGaAsP system formed on the GaAs substrate, and an AlGaAs system formed on the GaAs substrate but also to semiconductor lasers using an AlInGaAsP system formed on an InP substrate, an InAlGaP system formed on a GaAs substrate and a II–VI compound semiconductor laser formed on a GaAs substrate or a ZnSe substrate. The oscillation wavelengths are not limited to those in the 0.98 $\mu$m wavelength region and the 0.68 $\mu$m wavelength region. The present invention is applicable to semiconductor lasers having oscillation wavelengths in a 1.55 $\mu$m wavelength region, 1.48 $\mu$m wavelength region, 0.65 $\mu$m wavelength region and 0.63 $\mu$m wavelength region.

Third Embodiment

Figure 6:
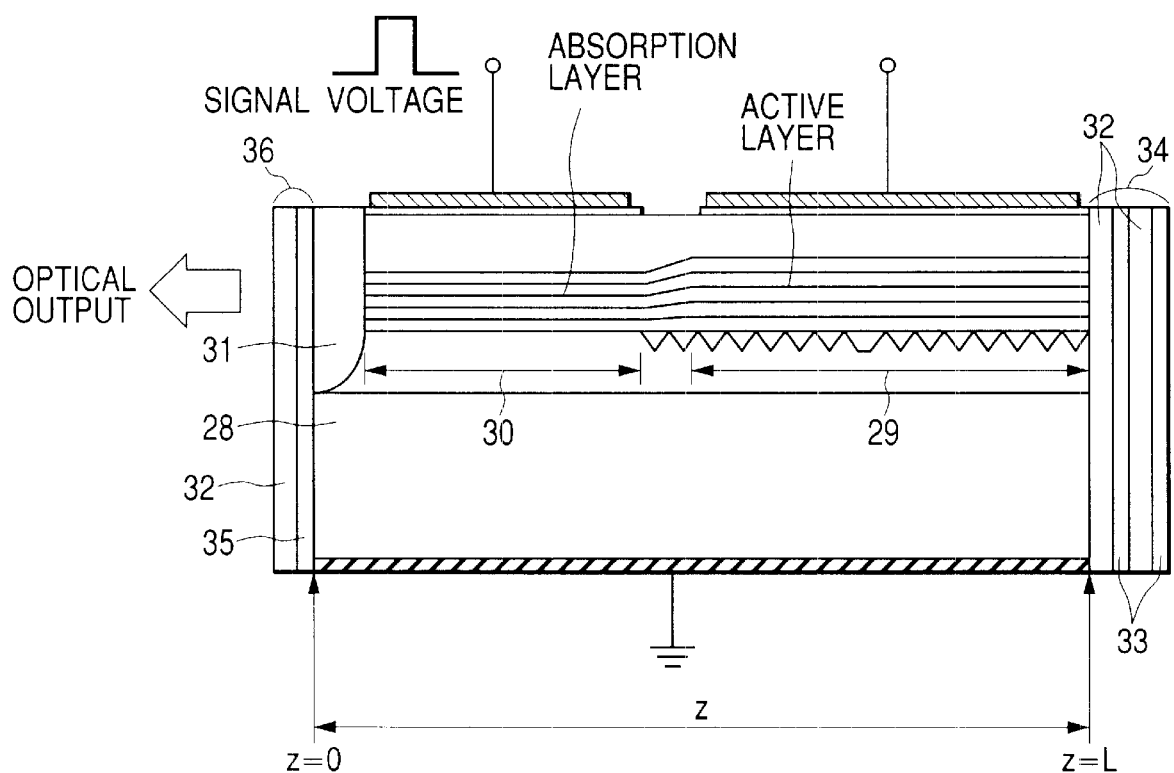
FIG. 6 is a typical sectional view of an optical integrated circuit in a third embodiment according to the present invention on a plane parallel to the direction of travel of light.

An optical integrated circuit in a third embodiment according to the present invention will be described with reference to FIG. 6, which shows the optical integrated circuit in the third embodiment in sectional view on a plane parallel to the direction of travel of light.

A distributed feedback semiconductor laser including an electroabsorption optical modulator (hereinafter referred to as "optical modulator integrated distributed feedback semiconductor laser") is formed by mounting a distributed feedback semiconductor laser unit (DFB semiconductor laser unit) 29 and an electroabsorption optical modulator (EA modulator) 30 on an n-type InP substrate 28. Thirty-two kinds of diffraction gratings are formed on a single wafer such that the distributed feedback semiconductor laser has oscillation wavelengths of thirty-two channels at intervals of 0.8 nm in the wavelength range of 1537 to 1562 nm. A facet window 31 of InP is formed on the front facet of the electroabsorption optical modulator. The position of the front facet of the electroabsorption optical modulator is at z=0 as shown in FIG. 6.

A HR film 34 is formed on the facet of the distributed feedback laser by a reactive sputtering method. The HR film 34 is comprised of two periods each of a low-refraction film 32 of SiO$_2$ and a high-refraction film 33 of hydrogenated amorphous silicon (a-Si:H). An AR film 36 comprised of a nitrogen-doped hydrogenated amorphous silicon film (a-Si:H(N) film) 35 according to the present invention and a SiO$_2$ film 32 is formed on the facet of the electroabsorption optical modulator 30, i.e., a radiative facet. Each film has a cavity length equal to a quarter of 1.55 $\mu$m equal to the wavelength of light.

A method of forming the antireflection film 36 will be described. First, Ar gas, hydrogen gas and nitrogen gas are supplied at 20 sccm, 6 sccm and 0.4 sccm, respectively, into a sputtering device. An ECR output of 500 W is applied to the sputtering device to produce a plasma and a RF power of 500 W is supplied to a Si target to form a 150.2 nm thick a-Si:H(N) film 35. The a-Si:H(N) film 35 has a refractive index of 2.58 with light of 1.55 $\mu$m. Subsequently, Ar gas and oxygen gas are supplied at 20 sccm and 7.7 sccm, respectively, into the sputtering device and an ECR power of 500 W is supplied to the sputtering device to produce a plasma and a RF power of 500 W is supplied to a Si target to form a 267.2 nm thick SiO$_2$ film 32. The SiO$_2$ film has a refractive index of 1.45 with light of 1.55 $\mu$m. The AR film 36 thus formed has a practically effective reflectance of 0.01% or below with light in the entire wavelength region of 1.47 to 1.62 $\mu$m.

Although this embodiment uses the ECR sputtering method for forming the protective film, the protective film may be formed by some other method, such as a plasma-assisted chemical vapor deposition method (p-CVD method), an electron beam deposition method (EB deposition method), an ion beam deposition method (IB deposition method), a helicon wave plasma-excited reactive deposition method, a RF plasma sputtering method or a magnetron sputtering method. Although the method of fabricating the optical integrated circuit in the third embodiment uses nitrogen gas as nitrogen source, molecules containing nitrogen and not containing oxygen, such as ammonia (NH$_3$), anhydrous hydrazine (N$_2$H$_4$) or hydrogen azide (HN$_3$) may be used instead of nitrogen gas. Naturally, nitrogen may be supplied in active radical beams, ion beams or atomic beams by using an ECR plasma, a RF plasma or a helicon wave plasma or by a thermal excitation method, an electron beam excitation method or a glow discharge method instead of supplying nitrogen gas together with hydrogen gas and argon gas.

The present invention enhances the reliability of the facet protecting film of a high-power semiconductor laser by a simple method, improves the yield and reduces the cost. The present invention forms an antireflection film for an optical modulator integrated light source for wavelength division multiplex optical communication by a simple method, improves the yield and reduces the cost.

The semiconductor laser of the present invention is capable of stably operating at high output power for a long period of operation. For example, a high-power laser having an oscillation wavelength in the range of 600 nm to 1 $\mu$m and capable of emitting light having a density of several megawatts per square centimeter can be driven continuously for a stable operation for a long period of time.

The present invention fabricates a semiconductor laser provided with a antireflection film capable of satisfactorily functioning in the oscillation wavelength range of 1.47 to 1.62 $\mu$m by a simple method.

What is claimed is:

1. A semiconductor radiative device comprising a layered film comprised of a low-refraction first dielectric film and a high-refraction second dielectric film having a refraction index greater than that of the first dielectric film, and formed on at least one of facets of an optical cavity, wherein the high-refraction second dielectric film is an amorphous dielectric film of nitrogen-doped hydrogenated silicon.

2. The semiconductor radiative device according to claim 1, wherein the second dielectric film has an amorphous dielectric film of nitrogen-doped hydrogenated silicon, and has a refractive index of 2.5 or above with light of a wavelength equal to an oscillation wavelength of a related semiconductor laser.

3. The semiconductor radiative device according to claim 1, wherein the second dielectric film has an amorphous dielectric film of nitrogen-doped hydrogenated silicon, and has a refractive index of 2.5 or above and an extinction coefficient of 0.005 or below with light of a wavelength equal to an oscillation wavelength of a related semiconductor laser.

4. The semiconductor radiative device according to claim 1, wherein the second dielectric film is an amorphous dielectric film of nitrogen-doped hydrogenated silicon, and an oscillation wavelength is 600 nm or above.

5. The semiconductor radiative device according to claim 1, wherein the second dielectric film is an amorphous dielectric film of a nitrogen-doped hydrogenated silicon having a refractive index of 2.5 or above with light of an oscillation wavelength of the semiconductor radiative device, and the oscillation wavelength of the semiconductor radiative device is 600 nm or above.

6. The semiconductor radiative device according to claim 1, wherein the second dielectric film is an amorphous dielectric film of nitrogen-doped hydrogenated silicon having a refractive index of 2.5 or above and an extinction coefficient of 0.005 or below with light of a wavelength equal to an oscillation wavelength of the semiconductor radiative device, and an oscillation wavelength is 600 nm or above.

7. The semiconductor radiative device according to claim 1, wherein the amorphous dielectric film contains oxygen.

8. A semiconductor radiative device comprising:

a semiconductor substrate;

an optical cavity having a semiconductor crystal film and formed on the semiconductor substrate; and a high-reflection layered film formed at least on one of facets of the optical cavity, and comprised of a low-refraction first dielectric film and a high-refraction second dielectric film having a refractive index greater than that of the first dielectric film;

wherein the high-refraction second dielectric film is an amorphous dielectric film of nitrogen-doped hydrogenated silicon, and a dielectric film having a reflectance lower than that of the high-reflection layered film is formed on the other facet of the optical cavity.

9. A semiconductor radiative device comprising:

a semiconductor substrate;

an optical cavity having a semiconductor crystal film and formed on the semiconductor substrate; and a low-reflection layered film formed at least on one of facets of the optical cavity, and comprised of a low-refraction first dielectric film and a high-refraction second dielectric film having a refractive index greater than that of the first dielectric film;

wherein the high-refraction second dielectric film is an amorphous dielectric film of nitrogen-doped hydrogenated silicon, and a dielectric film having a reflectance higher than that of the low-reflection layered film is formed on the other facet of the optical cavity.

* * * * *